(12) United States Patent
Kang et al.

(10) Patent No.: US 9,028,974 B2
(45) Date of Patent: May 12, 2015

(54) OLED AND FABRICATING METHOD OF THE SAME

(75) Inventors: Min-Soo Kang, Daejeon (KR); Jeoung-Kwen Noh, Daejeon (KR); Jung-Hyoung Lee, Daejeon (KR)

(73) Assignee: LG Chem, Ltd., Seoul (KR)

( * ) Notice: Subject to any disclaimer, the term of this patent is extended or adjusted under 35 U.S.C. 154(b) by 1333 days.

(21) Appl. No.: 12/224,804

(22) PCT Filed: Mar. 7, 2007

(86) PCT No.: PCT/KR2007/001127
§ 371 (c)(1),
(2), (4) Date: Sep. 5, 2008

(87) PCT Pub. No.: WO2007/102704
PCT Pub. Date: Sep. 13, 2007

(65) Prior Publication Data
US 2009/0184628 A1 Jul. 23, 2009

(30) Foreign Application Priority Data
Mar. 7, 2006 (KR) .......................... 10-2006-0021365

(51) Int. Cl.
| | | |
|---|---|---|
| H01L 51/54 | (2006.01) | |
| H01L 51/52 | (2006.01) | |
| H01L 51/50 | (2006.01) | |
| H05B 33/10 | (2006.01) | |
| H01L 27/32 | (2006.01) | |

(52) U.S. Cl.
CPC ........... *H01L 51/5088* (2013.01); *H01L 51/504* (2013.01); *H01L 51/5056* (2013.01); *H01L 51/5004* (2013.01); *H01L 27/3209* (2013.01); *H01L 27/3239* (2013.01); *H01L 51/5092* (2013.01); *H05B 33/10* (2013.01)

(58) Field of Classification Search
USPC .......................................... 313/510
See application file for complete search history.

(56) References Cited

U.S. PATENT DOCUMENTS 5,703,436 A * 12/1997 Forrest et al. ................. 313/506
5,949,186 A 9/1999 Nagayama et al.
(Continued)

FOREIGN PATENT DOCUMENTS

EP   1 524 706 A2   4/2005
JP   10-50481       2/1998
(Continued)

*Primary Examiner* — Marie R. Yamnitzky
(74) *Attorney, Agent, or Firm* — McKenna Long & Aldridge, LLP

(57) ABSTRACT

The present invention provides an organic light emitting device comprising: a substrate; a first conductive layer and a second conductive layer, which are sequentially positioned on the substrate; and at least one organic material layer, including a light emitting layer, which is interposed between the first conductive layer and the second conductive layer; wherein the organic light emitting device comprises a pattern layer formed corresponding to the light emitting region between at least one organic material layer and at least one conductive layer of the first conductive layer and the second conductive layer; charges are injected or transported between the conductive layer and the organic material layer through the pattern layer; and charges are not directly injected or transported in the region in which two layers each in contact with the upper surface and the lower surface of the pattern layer are directly in contact, and a method for preparation thereof.

10 Claims, 2 Drawing Sheets

(56) References Cited

U.S. PATENT DOCUMENTS

| | | | |
|---|---|---|---|
| 6,436,559 B1 * | 8/2002 | Ueno et al. | 428/690 |
| 6,872,472 B2 | 3/2005 | Liao et al. | |
| 7,052,351 B2 | 5/2006 | Tutt et al. | |
| 2001/0022497 A1 | 9/2001 | Aoki et al. | |
| 2002/0158242 A1 * | 10/2002 | Son et al. | 257/40 |
| 2003/0151356 A1 | 8/2003 | Pichler | |
| 2004/0046498 A1 | 3/2004 | Aoki et al. | |
| 2004/0113547 A1 | 6/2004 | Son et al. | |
| 2005/0100760 A1 | 5/2005 | Yokoyama | |
| 2005/0255334 A1 | 11/2005 | Kang et al. | |
| 2005/0274961 A1 | 12/2005 | Iou | |
| 2006/0057750 A1 | 3/2006 | Aoki et al. | |
| 2006/0251922 A1 * | 11/2006 | Liao et al. | 428/690 |

FOREIGN PATENT DOCUMENTS

| | | |
|---|---|---|
| JP | 2001-160487 | 6/2001 |
| JP | 2001-176667 | 6/2001 |
| JP | 2001-237069 | 8/2001 |
| JP | 2001-527688 | 12/2001 |
| JP | 2006-4740 | 1/2006 |
| JP | 2006-503443 | 1/2006 |
| KR | 10-0690348 B1 | 3/2007 |
| TW | 200302994 | 8/2003 |
| WO | WO 98/28767 | 7/1998 |
| WO | WO 2004/061878 A2 | 7/2004 |

* cited by examiner

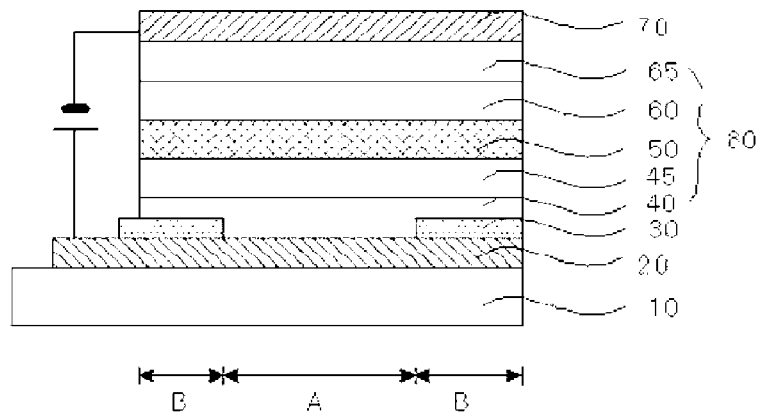
[Related Art] Fig. 1
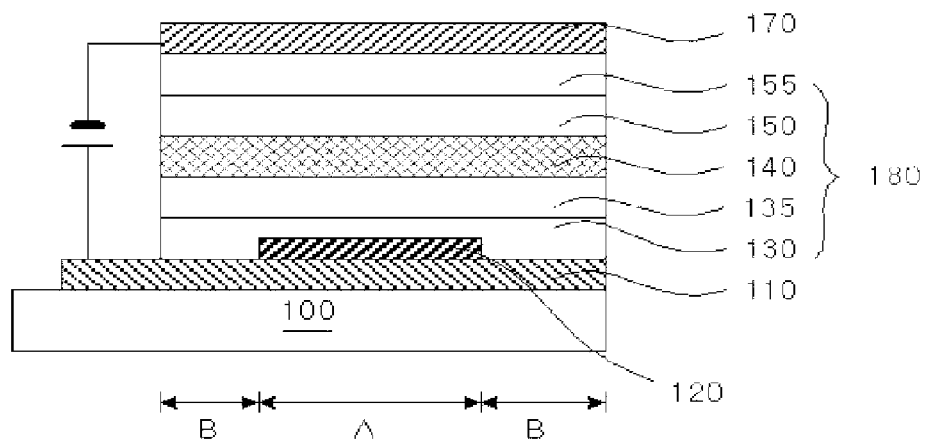
Fig. 2
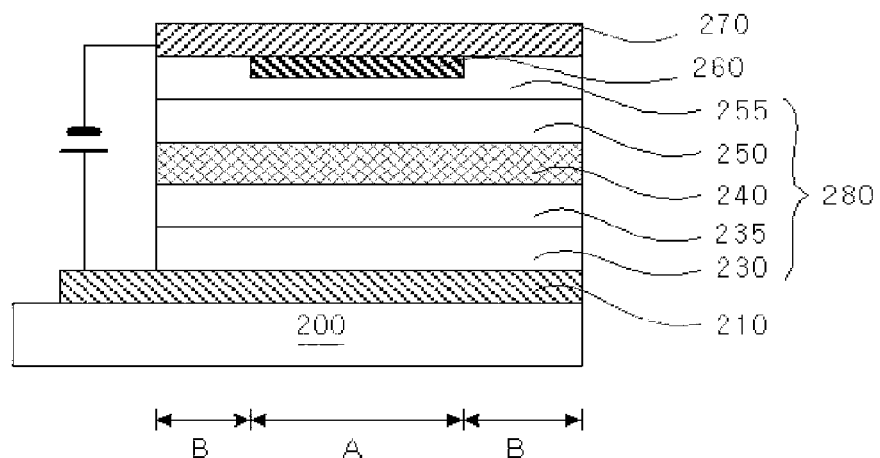
Fig. 3

OLED AND FABRICATING METHOD OF THE SAME

This application is a 371 national stage entry of International Application No. PCT/KR2007/001127, filed on Mar. 7, 2007 that claims priority to Korean Patent Application No. 10-2006-00021365, filed on Mar. 7, 2006, both of which are hereby incorporated by reference in their entirety.

TECHNICAL FIELD

The present invention relates to an organic light emitting device, and to a method for preparation thereof. More specifically, the present invention relates to an organic light emitting device comprising a pattern layer which is capable of lowering the energy barrier from an electrode for charge injection or charge extraction to an organic material layer, and to a method for preparation thereof.

This application claims priority benefits from Korean Patent Application No. 10-2006-0021365, filed on Mar. 7, 2006, the entire contents of which are fully incorporated herein by reference.

BACKGROUND ART

An organic light emitting device typically includes two electrodes, and an organic material layer interposed between the anode and the cathode, in which electric current is converted into visible light by injecting electrons and holes to the organic material layer, thereby emitting light.

FIG. 1 is a schematic diagram which illustrates a cross-sectional diagram of a general organic light emitting device as one of the conventional organic light emitting devices.

With reference to FIG. 1, the organic light emitting device comprises a light emitting layer (50) interposed between two electrodes, for example, an anode electrode (20), and a cathode electrode (70). Any one of the two electrodes, for example, the anode electrode (20) is disposed on a transparent substrate (10), and transmits light emitted from the light emitting layer (50). The organic light emitting device can further comprise at least one layer selected from the group consisting of an electron injecting layer (65), an electron transporting layer (60), a hole transporting layer (45), and a hole injecting layer (40) in order to improve the performance. Further, the organic light emitting device can comprise an insulating layer (30) on the electrode of the transparent substrate (10) in order to distinguish the light emitting region (A) from the non-light emitting region (B).

The two electrodes (20, 70) can be formed of a metal, a metal oxide or a conductive polymer. The materials for forming the electrodes can have unstable characteristics on the interface with the organic material layer. Further, heat applied from the outside, internal heat which can be generated upon driving the organic light emitting device, and the electrical field applied to the organic light emitting device can give an adverse effect on the performance of the device. The drive voltage can be increased for the device operation due to the difference in the conductive energy level between the electron/hole injecting layer (65/40) or the electron/hole transporting layer (60/45), and the organic material layer.

Accordingly, it is important to minimize the energy barrier to electron/hole injection/extraction from or to the electrode, and it is also important to stabilize the interface between the electron/hole injecting layer or electron/hole transporting layer, and the organic material layer, and thus a technique for improving this can be developed.

For this, for the anode electrode of the organic light emitting device, a material having HOMO (highest occupied molecular orbital) energy level such that the anode electrode is modulated to have a Fermi energy level similar to the HOMO energy level of the hole injecting layer, or having a HOMO energy level similar to the Fermi energy level of the anode electrode is selected as a hole injecting layer.

Since the hole injecting layer should be selected, taking into consideration not only the Fermi energy level of the anode electrode, but also the HOMO energy level of the hole transporting layer or the light emitting layer, there is some limitation on selection of the materials for the hole injecting layer. Accordingly, a method for modulating the Fermi energy of the anode electrode is generally employed for the preparation of the organic light emitting device.

DISCLOSURE OF INVENTION

Technical Problem

It is an object of the present invention to provide an organic light emitting device which allows light emission corresponding to the shapes of the pattern layer by forming the pattern layer which is capable of lowering the energy barrier to hole or electron-injecting or transporting between the electrode and the organic material layer, and a method for preparation thereof.

It is another object of the present invention to provide an organic light emitting device comprising an electrode formed of a wider range of materials by forming the pattern layer which is capable of lowering the energy barrier to hole or electron-injecting or transporting between the electrode and the organic material layer, and a method for preparation thereof.

Technical Solution

In order to solve the above-described objects, the present invention provides an organic light emitting device comprising: a substrate; a first conductive layer and a second conductive layer, which are sequentially positioned on the substrate; and at least one organic material layer, including a light emitting layer, which is interposed between the first conductive layer and the second conductive layer; wherein the organic light emitting device comprises a pattern layer formed corresponding to the light emitting region between at least one organic material layer and at least one conductive layer of the first conductive layer and the second conductive layer; charges are injected or transported between the conductive layer and the organic material layer through the pattern layer; and charges are not directly injected or transported in the region in which two layers each in contact with the upper surface and the lower surface of the pattern layer are directly in contact.

The present invention provides a stacked organic light emitting device comprising: a first conductive layer; at least one intermediate conductive layer; a second conductive layer; and at least one organic material layer, including a light emitting layer, which is each disposed between the conductive layers; wherein the stacked organic light emitting device comprises a pattern layer formed corresponding to the light emitting region between at least one of the conductive layers and at least one organic material layer; charges are injected or transported between the conductive layer and the organic material layer through the pattern layer; and charges are not directly injected or transported in the region in which two layers each in contact with the upper surface and the lower surface of the pattern layer are directly in contact.

Further, the present invention provides a method of preparing an organic light emitting device comprising: the steps of sequentially stacking a first conductive layer, at least one organic material layer including a light emitting layer, and a second conductive layer on a substrate; wherein the method comprises a step of forming a pattern layer corresponding to the light emitting region between at least one organic material layer and at least one conductive layer of the first conductive layer and the second conductive layer using materials which allow charges to be injected or transported between the conductive layer and the organic material layer through the pattern layer; a step of forming two layers each in contact with the upper surface and the lower surface of the pattern layer using materials which allow charges not to be directly injected or transported in the region in which two layers are directly in contact.

Advantageous Effects

The organic light emitting device according to the present invention has an effect of lowering the electrical barrier to hole or electron injection in the interface between the conductive layer and the organic material layer, by incorporating a pattern layer between the conductive layer and the organic material layer. Thus, the present invention has an advantage of improving the light emitting mechanism by improving the charge injecting ability. Further, electrodes formed of a wider range of materials can be provided by forming a pattern layer which is capable of lowering the electrical barrier to charge injection in the interface between the electrode and the organic material layer. Further, the stacked structure has an advantage that a plurality of pattern layers can be formed in different forms, thereby realizing various light emitting forms.

BRIEF DESCRIPTION OF THE DRAWINGS

FIG. 1 illustrates a cross-sectional diagram of the conventional organic light emitting device, FIG. 2 illustrates a cross-sectional diagram of the organic light emitting device according to a first embodiment of the present invention, FIG. 3 illustrates a cross-sectional diagram of the organic light emitting device according to a second embodiment of the present invention.

Figure 4:
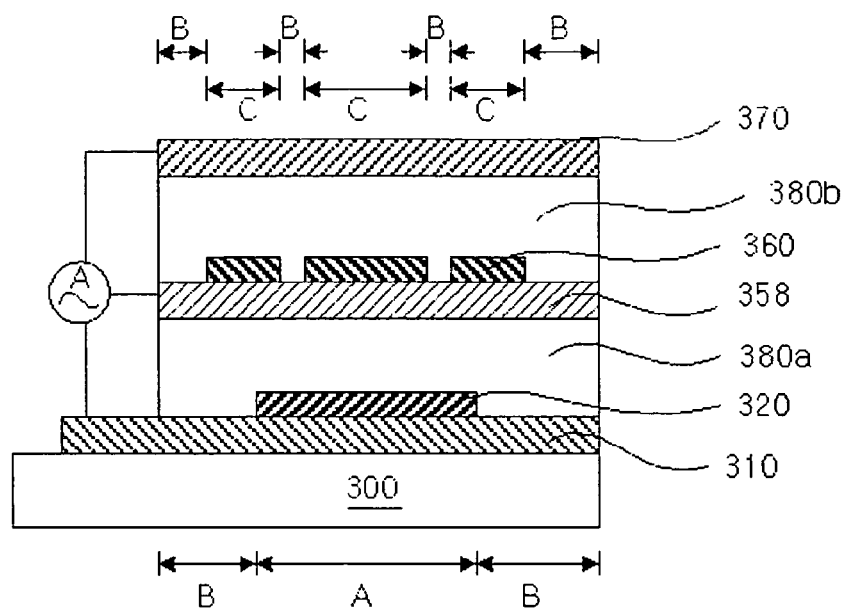
FIG. 4 illustrates a cross-sectional diagram of the organic light emitting device according to a third embodiment of the present invention.

NUMERAL REFERENCE 10, 100, 200, 300; Substrate
50, 140, 240; Light emitting layer
80, 180, 280, 380a, 380b; Organic material layer
20, 70; Electrode
30; Insulating layer
110, 210, 310; First conductive layer
170, 270, 370; Second conductive layer
358; Third conductive layer
120, 260, 320, 360; Pattern layer

MODE FOR THE INVENTION

Here in below, the present invention will be described in detail. The organic light emitting device according to the present invention is an organic light emitting device comprising: a substrate; a first conductive layer and a second conductive layer, which are sequentially positioned on the substrate; and at least one organic material layer, including a light emitting layer, which is interposed between the first conductive layer and the second conductive layer; wherein the organic light emitting device comprises a pattern layer formed corresponding to the light emitting region between at least one organic material layer and at least one conductive layer of the first conductive layer and the second conductive layer; charges are injected or transported between the conductive layer and the organic material layer through the pattern layer; and charges are not directly injected or transported in the region in which two layers each in contact with the upper surface and the lower surface of the pattern layer are directly in contact. Specifically, the present invention can provide an organic light emitting device having a light emission region corresponding to the shapes of the pattern layer by using the pattern layer which is capable of lowering the electrical barrier for hole or electron-injection or transport between the electrode and the organic material layer.

According to the present invention, the light generated from the organic material layer can be emitted in the direction to the substrate (bottom emission), in the opposite direction to the substrate (top emission), or the both.

According to the present invention, the pattern layer is formed of organic materials, inorganic materials, or a mixture thereof, and the materials are not particularly limited as long as they have energy levels which allow charges to be injected or transported between the conductive layer and the organic material layer through the pattern layer. The pattern layer can serve as at least one of the organic material layers constituting the conventional organic light emitting devices, such as a hole injecting layer, a hole transporting layer, a hole blocking layer, an electron transporting layer, or an electron injecting layer. In addition, it may not serve as an additional other layer, as long as it does not give any adverse effect on the charge transfer of the device. For example, if the conductive layer in contact with the pattern layer is an anode, the pattern layer can be composed of materials for a hole injecting layer, or a hole transporting layer. Further, if the conductive layer in contact with the pattern layer is a cathode, the pattern layer can be composed of materials for a hole blocking layer, an electron transporting layer, or an electron injecting layer.

In the present invention, the materials for two layers each in contact with the upper surface and the lower surface of the pattern layer are not particularly limited, as long as each layer has a suitable energy level such that charges are not directly injected or transported in the region between two layers, and does not give any adverse effect on the driving the entire device.

In the present invention, the first conductive layer, and the second conductive layer may be an anode electrode and a cathode electrode, respectively, or a cathode electrode, and an anode electrode, respectively.

According to one embodiment of the present invention, the pattern layer is an n-type organic material layer in contact with at least one conductive layer of the first conductive layer and the second conductive layer, and the organic material layer in contact with the pattern layer, being a p-type organic material layer, which will form an NP junction with the pattern layer. The Fermi level of the conductive layer, the LUMO energy level of the pattern layer, and the HOMO energy level of the organic material layer in contact with the pattern layer can satisfy the following equations (1) and (2):

$$0 \text{ eV} < E_{nL} - E_{F1} \leq 4 \text{ eV} \tag{1}$$

$$E_{pH} - E_{nL} \leq 1 \text{ eV} \tag{2}$$

In the above equations (1) and (2), $E_{F1}$ is the Fermi energy level of the conductive layer, $E_{nL}$ is the LUMO energy level of the pattern layer, and $E_{pH}$ is the HOMO energy level of the organic material layer, which would form an NP junction with the pattern layer. Further, the n-type organic material layer can have a LUMO energy level of 4 to 7 eV, and an electron mobility of $10^{-8}$ cm$^2$/Vs to 1 cm$^2$/Vs.

In the above embodiment, the conductive layer in contact with the pattern layer may be a first conductive layer, or a second conductive layer. If the conductive layer in contact with the pattern layer is the first conductive layer, the second conductive layer may be formed of Aluminum (Al), silver (Ag), or materials for a transparent electrode, such as ITO. The organic material layer can further comprise at least one layer selected from the group consisting of a hole injecting layer (HIL), a hole transporting layer (HTL), an electron transporting layer (ETL), and an electron injecting layer (EIL). In the above embodiment, a pattern layer can be further incorporated between the second conductive layer and the organic material layer, and in this case, the additional pattern layer can be composed of at least one selected from the group consisting of LiF, NaF, CsF, Ca, Mg, and MgO.

The present invention further provides a stacked organic light emitting device comprising: a first conductive layer; at least one intermediate conductive layer; a second conductive layer; and at least one organic material layer, including a light emitting layer, which is each disposed between the conductive layers; wherein the stacked organic light emitting device comprises a pattern layer formed corresponding to the light emitting region between at least one of the conductive layers and at least one organic material layer; charges are injected or transported between the conductive layer and the organic material layer through the pattern layer; and charges are not directly injected or transported in the region in which two layers each in contact with the upper surface and the lower surface of the pattern layer are directly in contact.

The stacked organic light emitting device according to the present invention preferably comprises both of the pattern layer between each conductive layer and the organic material layer disposed thereon. If the device comprises two or more pattern layers, these pattern layers may have the same or different patterns. By forming various forms of the pattern layers comprising multiple layers, various light emitting forms can be accomplished.

According to one embodiment of the present invention, the device comprises a third conductive layer disposed between the first conductive layer and the second conductive layer; comprises at least organic material layer including a light emitting layer on and below the third conductive layer; and comprises a pattern layer formed corresponding to the light emitting region between at least one organic material layer of the first conductive layer, the second conductive layer, and the third conductive layer. In this case, the first conductive layer, the second conductive layer, and the third conductive layer are each electrically connected with each other at a ground potential, and an alternating current voltage can be applied to the third conductive layer, but not limited thereto.

The organic light emitting device can be used for display devices, which can be in turn used for an audio display, an advertising display, a logo display, a domestic display appliance, or the like.

Further, the present invention provides a method of preparing an organic light emitting device comprising: the steps of sequentially stacking a first conductive layer, at least one organic material layer including a light emitting layer, and a second conductive layer on a substrate; wherein the method comprises a step of forming a pattern layer corresponding to the light emitting region between at least one organic material layer and at least one conductive layer of the first conductive layer and the second conductive layer using materials which allow charges to be injected or transported between the conductive layer and the organic material layer through the pattern layer; a step of forming two layers each in contact with the upper surface and the lower surface of the pattern layer using materials which allow charges not to be directly injected or transported in the region in which two layers are directly in contact.

According to one embodiment of the present invention, there is provided a method of preparing the organic light emitting device, comprising a step of forming a fust conductive layer on a substrate; a step of forming a pattern layer corresponding to the light emitting region on the first conductive layer; a step of forming at least organic material layer, including a light emitting layer, on the exposed portion of the first conductive layer and the pattern layer; and a step of forming a second conductive layer on the organic material layer, wherein the pattern layer is formed of materials which allow charges to be injected or transported between the first conductive layer and the organic material layer through the pattern layer; and the organic material layer in contact with the pattern layer is formed of materials which does not allows direct charge injection or transport from the first conductive layer in the region in contact with the first conductive layer. The first conductive layer can be formed of an anode electrode, and the second conductive layer can be formed of a cathode electrode. The pattern layer of the anode electrode can be formed of a hole injecting layer, or a hole transporting layer. Moreover, the pattern layer can be formed of an n-type organic material, and the organic material layer in contact with the pattern layer can be formed of a p-type organic material.

According to another embodiment of the present invention, there is provided a method of preparing the organic light emitting device, comprising a step of forming a first conductive layer on a substrate; a step of forming at least organic material layer, including a light emitting layer, on the first conductive layer; a step of forming a pattern layer corresponding to the light emitting region on the organic material layer; and a step of forming a second conductive layer on the exposed portion of the organic material layer and the pattern layer, wherein the pattern layer is formed of materials which allow charges to be injected or transported between the second conductive layer and the organic material layer through the pattern layer; and the organic material layer in contact with the pattern layer is formed of materials which does not allows direct charge injection or transport from the second conductive layer in the region in contact with the second conductive layer. The first conductive layer can be formed of an anode electrode, and the second conductive layer can be formed of a cathode electrode. The pattern layer formed in the lower surface of the cathode electrode can be formed of a hole blocking layer, an electron transporting layer, or an electron injecting layer.

According to another embodiment of the present invention, there is provided a method of preparing the organic light emitting device, comprising a step of forming a first conductive layer on a substrate; a step of forming a first pattern layer corresponding to the light emitting region on the first conductive layer; a step of forming at least organic material layer, including a light emitting layer, on the exposed portion of the first conductive layer and the first pattern layer; a step of forming a second pattern layer corresponding to the light emitting region on the organic material layer; and a step of forming a second conductive layer on the exposed portion of the organic material layer and the second pattern layer, wherein the first pattern layer is formed of materials which allow charges to be injected or transported between the first conductive layer and the organic material layer through the first pattern layer; the organic material layer in contact with the first pattern layer is formed of materials which does not allows direct charge injection or transport from the first conductive layer in the region in contact with the first conductive layer; the second pattern layer is formed of materials which allow charges to be injected or transported between the second conductive layer and the organic material layer through the second pattern layer; the organic material layer in contact with the second pattern layer is formed of materials which does not allows direct charge injection or transport from the second conductive layer in the region in contact with the second conductive layer.

According to another embodiment of the present invention, there is provided a method of preparing the organic light emitting device, comprising a step of forming a first conductive layer on a substrate; a step of forming a first pattern layer corresponding to the light emitting region on the first conductive layer; a step of forming at least first organic material layer, including a light emitting layer, on the exposed portion of the first conductive layer and the first pattern layer; a step of forming a third conductive layer on the first organic material layer; a step of forming a second pattern layer corresponding to the light emitting region on the third conductive layer; a step of forming at least second organic material layer, including a light emitting layer, on the exposed portion of the third conductive layer and the second pattern layer; and a step of forming a second conductive layer on the second organic material layer, wherein the first pattern layer is formed of materials which allow charges to be injected or transported between the first conductive layer and the organic material layer through the first pattern layer; the organic material layer in contact with the first pattern layer is formed of materials which does not allows direct charge injection or transport from the first conductive layer in the region in contact with the first conductive layer; the second pattern layer is formed of materials which allow charges to be injected or transported between the third conductive layer and the second organic material layer through the second pattern layer; the organic material layer in contact with the second pattern layer is formed of materials which does not allows direct charge injection or transport from the third conductive layer in the region in contact with the third conductive layer.

Here in below, preferable embodiments of the present invention will be described in detail with reference to the figures. However, the below-described embodiments will be provided by way of examples for the purpose of clearly explaining the spirit if the present invention to a skilled person in the art. Thus, the present invention is not limited to the below-described embodiments, and certain modifications of the following preferable embodiments will be made. In these specification, the same reference numerals are used to indicate like components.

FIG. 2 is a cross-sectional diagram of the organic light emitting device according to a first embodiment.

With reference to FIG. 2, the first conductive layer (110), and the second conductive layer (170) are sequentially disposed on the substrate (100). The first conductive layer (110) can be an anode electrode, and the second conductive layer (170) can be a cathode electrode.

The pattern layer (120) is provided between the first conductive layer (110) and the second conductive layer (170), that is, in contact with the first conductive layer (110). Here, the region corresponding to the pattern layer (120) will be a light emitting region (A), and the remaining region will be a non-light emitting region (B). The organic material layers (180) are disposed on the exposed portions of the first conductive layer (110) and the pattern layer (120). The organic material layers (180) include the light emitting layer (140), and can further include at least one selected from the group consisting of a hole injecting layer (130), a hole transporting layer (135), an electron transporting layer (150), and an electron injecting layer (155).

If the first conductive layer (110) is an anode electrode, the hole injecting layer (130) and the first conductive layer (110) have energy levels such that holes are not injected from the first conductive layer (110) to the hole injecting layer (130) in the region where they are in contact with each other. Further, the pattern layer (120), the first conductive layer (110) in contact with the pattern layer (120), and the hole injecting layer (130) in contact with the pattern layer (120) have energy levels such that holes can be injected from the first conductive layer (110) to the hole injecting layer (130) through the pattern layer (120). By this, charges are injected and transported only in the region corresponding to the light emitting region (A), that is, the region of the pattern layer (120), thereby emitting light.

The pattern layer (120) can be formed of organic materials. Preferably, the pattern layer (120) can be an n-type organic material layer, and the hole injecting layer (130) in contact with the pattern layer (120) can be a p-type organic material layer. In this case, the pattern layer (120) and the hole injecting layer (130) will form an NP junction. Here, the Fermi level of the fust conductive layer, that is, the anode electrode (110), the LUMO energy level of the pattern layer (120), and the HOMO energy level of the hole transporting layer (130) preferably satisfy the following equations (1) and (2):

$$0 \text{ eV} < E_{nL} - E_{F1} \leq 4 \text{ eV} \quad (1)$$

$$E_{pH} - E_{nL} \leq 1 \text{ eV} \quad (2)$$

In the above equations (1) and (2), $E_{F1}$ is the Fermi energy level of the first conductive layer, $E_{nL}$ is the LUMO energy level of the pattern layer, and $E_{pH}$ is the HOMO energy level of the organic material layer, which would form an NP junction with the pattern layer.

Therefore, by incorporating the pattern layer (120) between the first conductive layer (110) of the organic light emitting device, that is, the anode electrode, and the hole injecting layer (130), the electrical barrier to the charge injection can be lowered at the interface between the first conductive layer and the organic material layer. As a result, the charge injecting ability can be improved, and thus electrodes formed of a wider range of materials can be provided.

The n-type organic material layer can comprise a compound of the following formula 1:

[Formula 1]

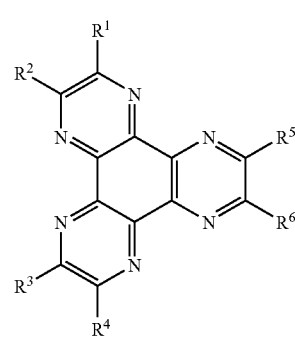

wherein in the formula 1, $R^1$ to $R^6$ are each selected from the group consisting of hydrogen, a halogen atom, nitrile (—CN), nitro (—NO$_2$), sulfonyl (—SO$_2$R), sulfoxide (—SOR), sulfonamide (—SO$_2$NR), sulfonate (—SO$_3$R), trifluoromethyl (—CF$_3$), ester (—COOR), amide (—CONHR or —CONRR'), substituted or unsubstituted linear or branched $C_1$-$C_{12}$ alkoxy, substituted or unsubstituted linear or branched $C_1$-$C_{12}$ alkyl, substituted or unsubstituted aromatic or non-aromatic heterocycle, substituted or un-substituted aryl, substituted or unsubstituted mono-arylamine or di-arylamine, and substituted or unsubstituted aralkylamine. In addition, R and R' are each selected from the group consisting of substituted or unsubstituted $C_1$-$C_{60}$ alkyl, substituted or un-substituted aryl, and substituted or unsubstituted 5- to 7-membered heterocycle.

Specific examples of the compound of the formula 1 include the compounds represented by the following formulae 1-1 to 1-6:

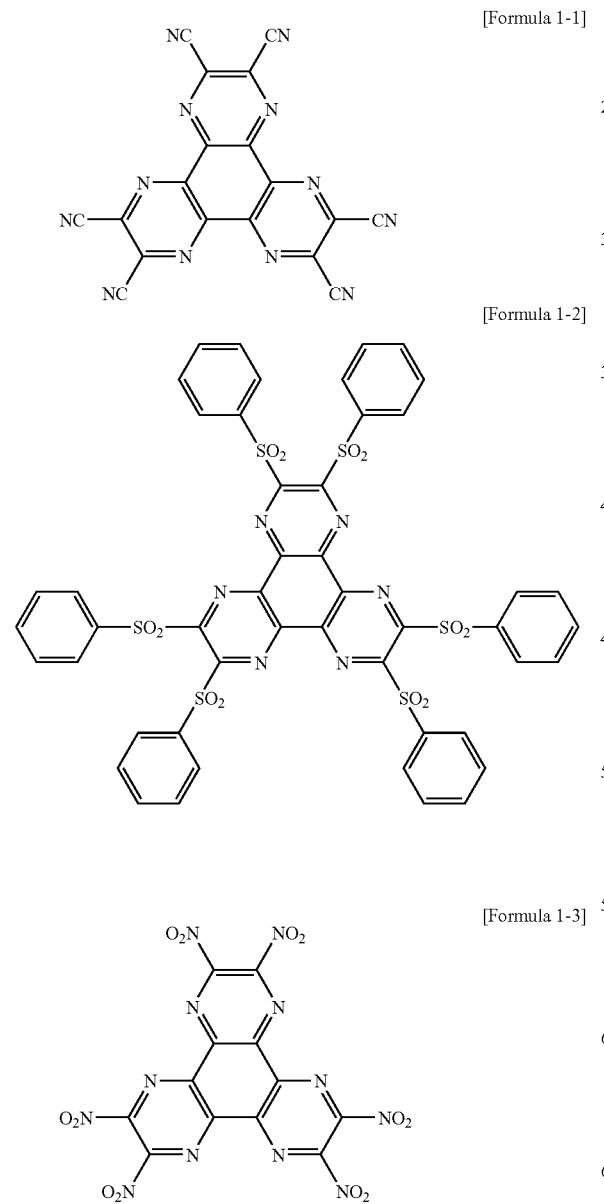

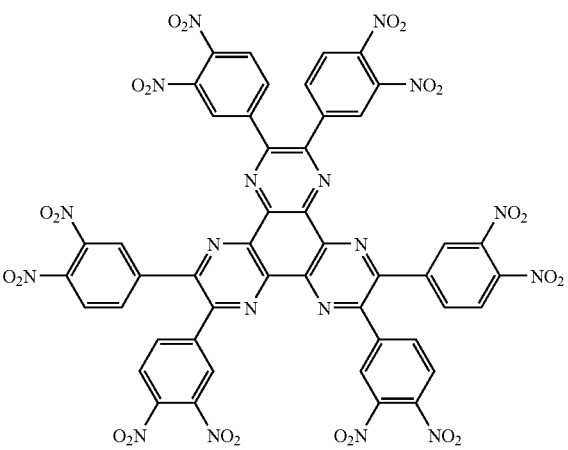

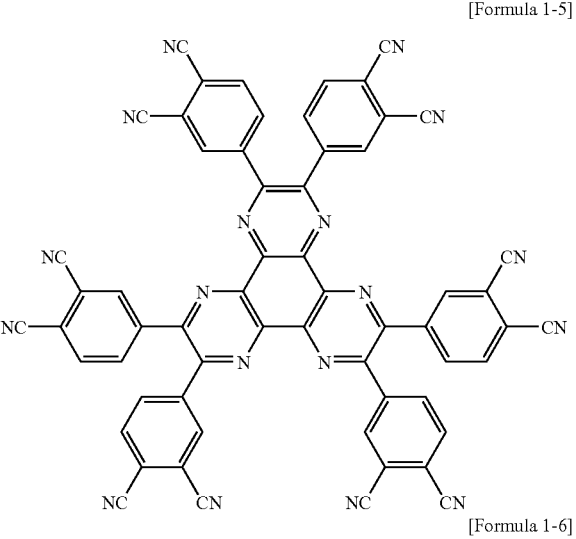

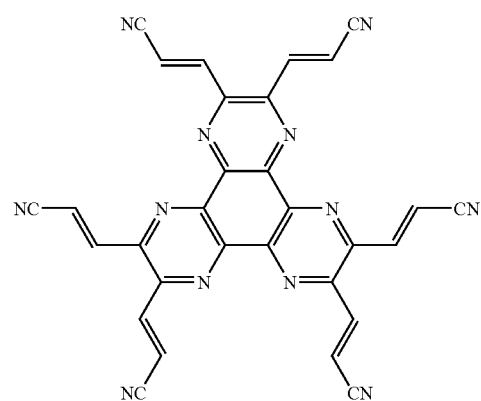

The light generated from the organic material layer (180) can be emitted in the direction to the substrate (100) (bottom emission), in the opposite direction to the substrate (100) (top emission), or the both.

FIG. 3 illustrates a cross-sectional diagram of the organic light emitting device according to a second embodiment of the present invention.

With reference to FIG. 3, unlike the first embodiment, in the second embodiment, the pattern layer (260) is disposed to be in contact with the second conductive layer (270). Specifically, the pattern layer (260) corresponding to the light emitting region (A), which is in contact with the second conductive layer (270), among the second conductive layer (270) and the first conductive layer (210) disposed on the substrate (200) is provided. The first conductive layer (210) can be an anode electrode, and the second conductive layer (270) can be a cathode electrode. The organic material layer (280) is interposed between the pattern layer (260), and the exposed portion of the second conductive layer (270) and the first conductive layer (210). The organic material layer (280) comprises the light emitting layer (240), and can further comprise at least one selected from the group consisting of the hole injecting layer (230), the hole transporting layer (235), the electron transporting layer (250), and the electron injecting layer (255).

The electron injecting layer (255) in contact with the pattern layer (260), and the second conductive layer (270) have energy levels such that electrons are not injected from the second conductive layer (270) to the electron injecting layer (255) in the region where they are in contact with each other. Further, the pattern layer (260), the second conductive layer (270) in contact with the pattern layer (260), and the electron injecting layer (255) in contact with the pattern layer (260) have energy levels such that electrons can be injected from the second conductive layer to the electron injecting layer (255) through the pattern layer (260). By this, charges are injected and transported only in the region corresponding to the light emitting region (A), that is, the region of the pattern layer (260), thereby emitting light.

Specifically, in the first embodiment, a pattern layer in contact with the anode electrode is provided in the region corresponding to the light emitting region to minimize the energy barrier between the anode electrode and the organic material layer, and thus to improve the hole injecting ability. On the other hand, in the second embodiment, a pattern layer in contact with the cathode electrode is provided in the region corresponding to the light emitting region to minimize the energy barrier between the cathode electrode and the organic material layer. As a result, in the second embodiment, the electron injecting ability is improved, thereby accomplishing a patterned light emitting device.

The pattern layer (260) can be formed of inorganic materials. Preferably, it can be formed of any one selected from the group consisting of LiF, NaF, CsF, Ca, Mg, and MgO. Further, it can be formed of materials for a hole blocking layer, an electron transporting layer, or an electron injecting layer. Here, the second conductive layer (270), that is, the cathode electrode can be formed of aluminum (Al), silver (Ag), or a transparent electrode (ITO).

The organic light emitting device having such structure can also be a bottom emission device, a top emission device, or a top-and-bottom emission device.

FIG. 4 illustrates a cross-sectional diagram of the organic light emitting device according to a third embodiment of the present invention.

With reference to FIG. 4, in the third embodiment, there is suggested a stacked structure, comprising at least two organic material layers (380a, 380b). Specifically, a third conductive layer (358) is disposed between the first conductive layer (310) and the second conductive layer (370), and the first organic material layer (380a) and the second organic material layer (380b) are disposed on and below the third conductive layer (358), respectively.

Further, the pattern layers (320, 360) can be disposed on the first conductive layer (310) and/or the third conductive layer (358), and alternatively or additionally, on the lower surface of the first conductive layer (310) and/or the second conductive layer (370). Here, the first conductive layer (310) and the second conductive layer (370), and the third conductive layer (358) are electrically connected with each other at a ground potential, and an alternating current voltage can be applied to the third conductive layer (358) to apply a drive voltage required for the organic light emitting device.

The third embodiment also has an advantage that a pattern layer can be formed in the region corresponding to the light emitting region (A) to minimize the energy barrier between the conductive layer and the organic material layer, to enhance the charge mobility, and thus to control the light emitting mechanism. Further, by incorporating several forms of the pattern layers on each conductive layer, various light emitting forms, such as top emission device, bottom emission, and top-and-bottom emission, can be accomplished.

In the first through third embodiments, the organic light emitting device can be used for display devices, which can be in turn used for one selected from the group consisting of an audio display, an advertising display, a logo display, and a domestic display appliance.

With reference to FIGS. 2 to 4, the preparation method according to the present invention will be described as follows.

With reference to FIG. 2, as for the method of preparing the organic light emitting device according to a first embodiment of the present invention, first, a first conductive layer (110) is formed on a substrate (100). The substrate (100) can be formed of glass or plastic materials, and in the case of forming a bottom emission type of an organic light emitting device, it is preferable to form a transparent substrate. Further, the first conductive layer (110) can be preferably formed of a metal, a metal oxide or a conductive polymer.

The pattern layer (120) is formed on the first conductive layer (110). Using the processes such as dry or wet etching, deposition using a fine metal mask, and printing, the pattern layer (120) can be formed. The region corresponding to the pattern layer (120) will be a light emitting region (A), and the remaining region will be a non-light emitting region (B).

The organic material layer (180) is formed on the first conductive layer (110) exposed through the pattern layer (120), and the pattern layer (120). The organic material layer (180) is formed by stacking at least one selected from the hole injecting layer (130), the hole transporting layer (135), the light emitting layer (140), the electron transporting layer (150), and the electron injecting layer (155).

The hole injecting layer (130) in contact with the pattern layer (120) among the organic material layers, have energy levels such that holes are not directly injected from the first conductive layer (110) in the region where it is in contact with the first conductive layer (110). Further, the first conductive layer (110), the pattern layer (120), and the hole injecting layer (130) each have energy levels such that holes can be injected and transported from the first conductive layer (110) to the hole injecting layer (130) through the pattern layer (120).

The second conductive layer (170) is formed on the organic material layer (180) formed as above using a conductive material. The second conductive layer (170) can be formed of aluminum (Al), silver (Ag), or a transparent electrode (ITO). The first conductive layer (110) can be formed of the anode electrode, and the second conductive layer (170) can be formed of the cathode electrode. Moreover, the pattern layer (120) on the anode electrode (110) can be formed of the hole injecting layer, or the hole transporting layer.

Further, the pattern layer (120) is formed of an n-type organic material, and the hole injecting layer (130) can be formed of a p-type organic material. Here, the Fermi level of the first conductive layer (110), the HOMO energy level of the hole injecting layer (130), and the LUMO energy level of the pattern layer (120) preferably satisfy the above-described equations (1) and (2).

With reference to FIG. 3, a method for preparing the organic light emitting device according to a second embodiment of the present invention is described as follows.

First, the first conductive layer (210) is formed on the substrate (200). The substrate (200) can be a transparent substrate as in the first embodiment, and the first conductive layer (210) can be formed of a conductive material film. The organic material layer (280) is formed on the first conductive layer (210). The organic material layer (280) is formed, which comprises the light emitting layer (240), and can further comprise at least one selected from the group consisting of the hole injecting layer (230), the hole transporting layer (235), the electron transporting layer (250), and the electron injecting layer (255). The organic material layer (280) is formed to be in contact with the pattern layer (260).

The region corresponding to the region where the pattern layer (260) is formed will be a light emitting region (A), and the remaining region will be a non-light emitting region (B). The pattern layer (260) can be formed, using the processes such as etching, deposition using a fine metal mask, and printing, as described above. Further, the pattern layer (260) can be formed of at least one selected from the group consisting of LiF, NaF, CsF, Ca, Mg, MgO, and CaO.

The second conductive layer (270) is formed on the electron injecting layer (255) exposed through the pattern layer (260), and the pattern layer (260). Here, the electron injecting layer (255), and the second conductive layer (270) have energy levels such that electrons are not directly injected from the second conductive layer (270) to the electron injecting layer (255) in the region where they are in contact with each other. Further, the second conductive layer (270), the pattern layer (270), and the electron injecting layer (255) each have energy levels such that electrons can be injected from the second conductive layer (270) to the electron injecting layer (255) through the pattern layer (270). The second conductive layer (270) can be formed of aluminum (Al), silver (Ag), or a transparent electrode (ITO).

Further, the first conductive layer (210) can be formed of the anode electrode, and the second conductive layer (270) can be formed of the cathode electrode. Here, the pattern layer (280) formed below the cathode electrode can be formed of the hole blocking layer, the electron transporting layer, or the electron injecting layer.

With reference to FIG. 4, a method for preparing the organic light emitting device according to a third embodiment of the present invention is described as follows. In the present embodiment, an organic light emitting device in which at least two organic material layer units are stacked is formed. That is, as in the first embodiment, the first conductive layer (310) is formed on the substrate (300), the first pattern layer (320) is formed corresponding to the light emitting region (A) on the first conductive layer (310), and then the first organic material layer (380a) is formed on the first pattern layer (320), and the first conductive layer (310) exposed through the first pattern layer (320). However, unlike the first embodiment where the second conductive layer is formed on the first organic material layer (380a), the third conductive layer (358) is formed on the first organic material layer (380a) prior to forming the second conductive layer (370).

Then, the second pattern layer (360) is formed on the third conductive layer (358). The second pattern layer can be formed, which corresponds to another light emitting region (C). The second organic material layer (380b) is formed on the second pattern layer (360), and the third conductive layer (358) exposed through the second pattern layer (360), and the second conductive layer (370) is formed on the second organic material layer (380b).

Another third pattern layer can be formed between the first organic material layer (380a) and the third conductive layer (358), and/or between the second organic material layer (380b) and the second conductive layer (370). If the third pattern layer is formed, the third pattern layer can be formed of the hole blocking layer, the electron transporting layer, or the electron injecting layer.

The pattern layer, the conductive layer in contact with the pattern layer, and the organic material layer in contact with the pattern layer allow charges to be injected or transported through the pattern layer, respectively, and they have energy levels such that charges are not injected or transported from the conductive layer to the organic material layer in the region where the conductive layer is in contact with the organic material layer.

The first pattern layer (320), or the second pattern layer (360) can be formed of the hole injecting layer, or the hole transporting layer. Further, the first pattern layer (320), or the second pattern layer (360) can be an n-type organic material layer, and the first organic material layer (380a), or the second organic material layer (380b) can be a p-type organic material layer. The characteristics of the n-type organic material layer and the p-type organic material layer are the same as for the organic materials in the first embodiment.

In the third embodiment, the pattern layers having the above-described characteristics can be formed to lower the electrical barrier to the charge mobility in the light emitting region, and thus to improve the charge injecting ability. Further, various forms of pattern layers having multiple layers can be formed to accomplish various light emitting forms.

While the present invention is described with reference to preferable embodiments, those skilled in the art will appreciate that a variety of changes and modifications can be made without departing from the spirit and the scope of the present invention, as described in the following claims.

The invention claimed is:

1. An organic light emitting device comprising:

a substrate:

an anode layer positioned opposite the substrate;

an n-type organic material pattern layer comprising a compound of formula 1 or formula 1-6 and positioned directly in contact with the anode layer and opposite both the substrate and the anode;

a p-type organic material layer positioned directly in contact with the n-type organic material pattern layer and the anode layer, wherein the p-type organic material layer forms an NP junction with the n-type organic material pattern layer;

a light emitting layer positioned opposite both the p-type organic material layer and the anode;

a cathode positioned opposite both the light emitting layer and the p-type organic material layer;

a light emitting region in which the anode is directly in contact with the n-type organic material pattern layer and the n-type organic material pattern layer is directly in contact with the p-type organic material layer; and a non-light emitting region in which the p-type organic material layer is directly in contact with the anode;

wherein formula 1 is as follows:

[Formula 1]

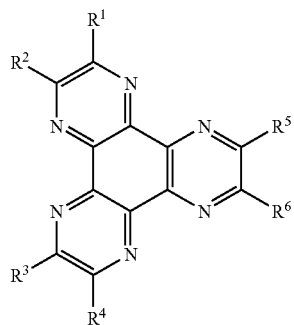

wherein $R^1$ to $R^6$ are each selected from the group consisting of hydrogen, a halogen atom, nitrile (—CN), nitro (—NO$_2$), sulfonyl (—SO$_2$R), sulfoxide (—SOR), sulfonamide (—SO$_2$NR), sulfonate (—SO$_3$R), trifluoromethyl (—CF$_3$), ester (—COOR), amide (—CONHR or —CONRR'), substituted or unsubstituted linear or branched $C_1$-$C_{12}$ alkoxy, substituted or unsubstituted linear or branched $C_1$-$C_{12}$ alkyl, substituted or unsubstituted aromatic or non-aromatic heterocycle, substituted or unsubstituted aryl, substituted or unsubstituted monoarylamine or di-arylamine, and substituted or unsubstituted aralkylamine, and R and R' are each selected from the group consisting of substituted or unsubstituted $C_1$-$C_{60}$ alkyl, substituted or unsubstituted aryl, and substituted or unsubstituted 5- to 7-membered heterocycle; and wherein formula 1-6 is as follows:

[Formula 1-6]

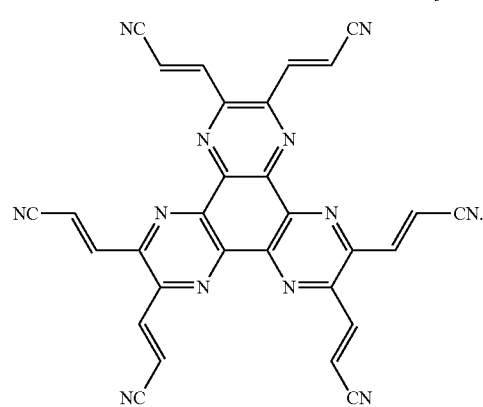

2. The organic light emitting device according to claim 1, wherein the p-type organic material layer is a hole injecting layer or a hole transporting layer.

3. The organic light emitting device according to claim 1, further comprising at least one layer selected from the group consisting of a hole injecting layer (HIL), a hole transporting layer (HTL), a hole blocking layer (HBL), an electron transporting layer (ETL), and an electron injecting layer (EIL).

4. The organic light emitting device according to claim 1, wherein light generated from the light emitting layer is emitted in the direction to the substrate (bottom emission), in the opposite direction to the substrate (top emission), or both.

5. The organic light emitting device according to claim 1, wherein the Fermi level of the anode, the LUMO energy level of n-type organic material pattern layer, and the HOMO energy level of the p-type organic material layer satisfy the following equations (1) and (2):

$$0\,eV < E_{nL} - E_{F1} \leq 4\ eV \quad (1)$$

$$E_{pH} - E_{nL} \leq 1\ eV \quad (2)$$

wherein in the equations (1) and (2), $E_{F1}$ is the Fermi energy level of the anode, $E_{nL}$ is the LUMO energy level of the n-type organic material pattern layer, and $E_{pH}$ is the HOMO energy level of the p-type organic material layer.

6. The organic light emitting device according to claim 1, wherein the n-type organic material pattern layer has a LUMO energy level of 4 to 7 eV, and an electron mobility of $10^{-8}$ cm$^{-2}$/Vs to 1 cm$^{-2}$/Vs.

7. The organic light emitting device according to claim 1, wherein the n-type organic material pattern layer comprises a compound selected from the compounds represented by the following formulae 1-1 to 1-6:

[Formula 1-1]

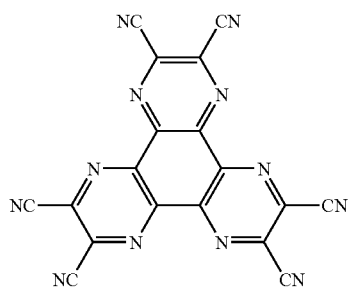

[Formula 1-2]

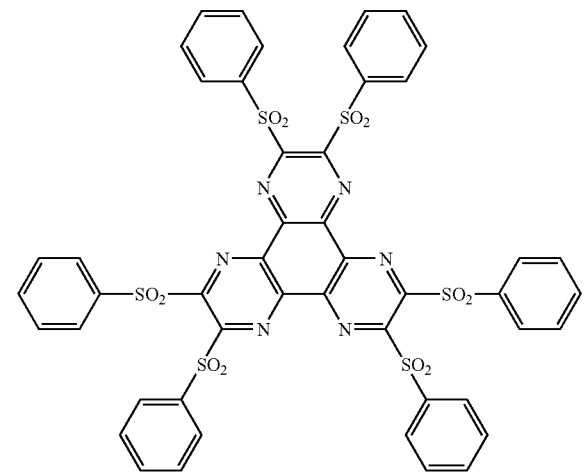

[Formula 1-3]

-continued

[Formula 1-4]

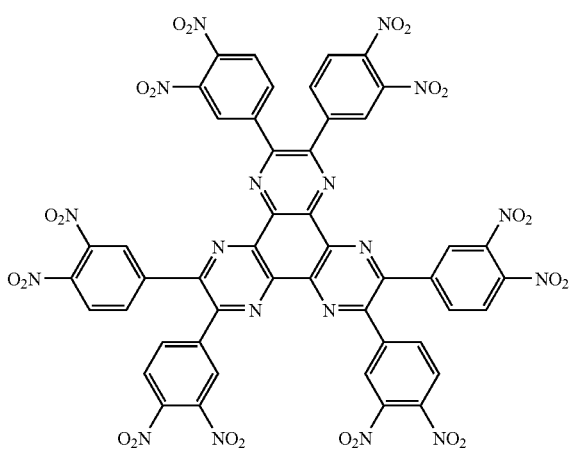

[Formula 1-5]

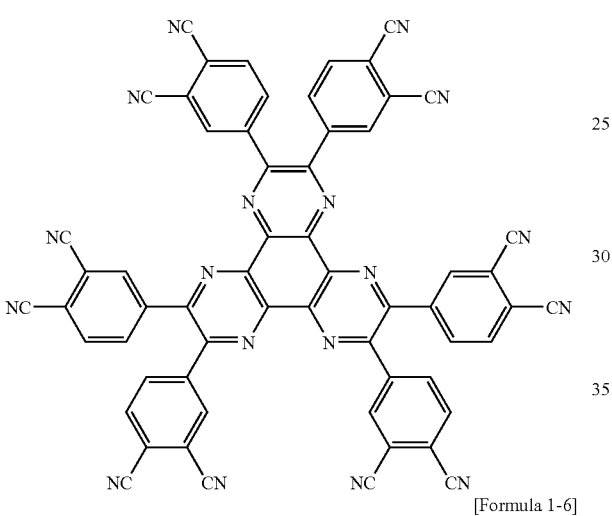

[Formula 1-6]

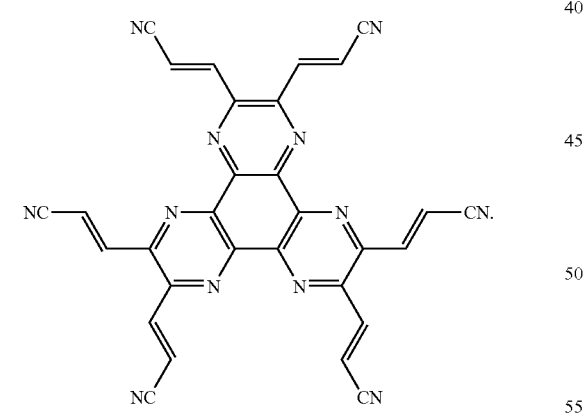

8. A display device comprising the organic light emitting device according to claim 1.

9. An organic light emitting device comprising:
a first conductive layer;
a first n-type organic material pattern layer comprising a compound of formula 1 or formula 1-6 and positioned directly in contact with the first conductive layer;
a first p-type organic material layer positioned directly in contact with both the first conductive layer and the first n-type organic material pattern layer, wherein the first p-type organic material layer forms an NP junction with the first n-type organic material pattern layer;
a second conductive layer positioned opposite both the first p-type organic material layer and the first conductive layer;
a second n-type organic material pattern layer comprising a compound of formula 1 or formula 1-6 and directly in contact with the second conductive layer and positioned opposite both the second conductive layer and the first conductive layer;
a second p-type organic material layer positioned directly in contact with both the second conductive layer and the second n-type organic material pattern layer, wherein the second p-type organic material layer forms an NP junction with the second n-type organic material pattern layer;
a third conductive layer positioned opposite both the first conductive layer and the second conductive layer;
a first light-emitting region in which the first conductive layer is directly in contact with the first n-type organic material pattern layer and the first n-type organic material pattern layer is directly in contact with the first p-type organic material layer; and
a first non-light emitting region in which the first p-type organic material layer is directly in contact with the first conductive layer;
a second light-emitting region in which the second conductive layer is directly in contact with the second n-type organic material pattern layer and the second n-type organic material pattern layer is directly in contact with the second p-type organic material layer; and
a second non-light emitting region in which the second p-type organic material layer is directly in contact with the second conductive layer;
wherein formula 1 is as follows:

[Formula 1]

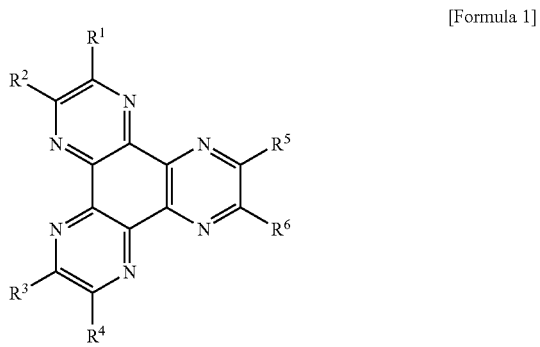

wherein $R^1$ to $R^6$ are each selected from the group consisting of hydrogen, a halogen atom, nitrile (—CN), nitro (—NO$_2$), sulfonyl (—SO$_2$R), sulfoxide (—SOR), sulfonamide (—SO$_2$NR), sulfonate (—SO$_3$R), trifluoromethyl (—CF$_3$), ester (—COOR), amide (—CONHR or —CONRR'), substituted or unsubstituted linear or branched $C_1$-$C_{12}$ alkoxy, substituted or unsubstituted linear or branched $C_1$-$C_{12}$ alkyl, substituted or unsubstituted aromatic or non-aromatic heterocycle, substituted or unsubstituted aryl, substituted or unsubstituted mono-arylamine or di-arylamine, and substituted or unsubstituted aralkylamine, and R and R' are each selected from the group consisting of substituted or unsubstituted $C_1$-$C_{60}$ alkyl, substituted or unsubstituted aryl, and substituted or unsubstituted 5- to 7-membered heterocycle; and wherein formula 1-6 is as follows:

[Formula 1-6]

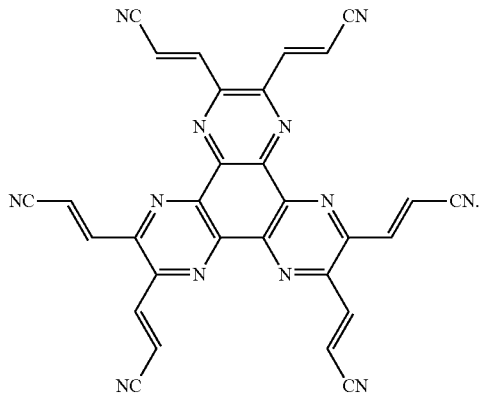

10. A method of preparing an organic light emitting device comprising:
    stacking an anode layer a p-type organic material layer, a light emitting layer, and a cathode layer on a substrate; and
    forming a light emitting region by forming an n-type organic material pattern layer comprising a compound of formula 1 or formula 1-6 directly in contact with the anode and also directly in contact with the p-type organic material layer and forming an NP junction therewith;
    forming a non-light emitting region in which the p-type organic material layer is directly in contact with the anode;
wherein formula 1 is as follows:

[Formula 1]

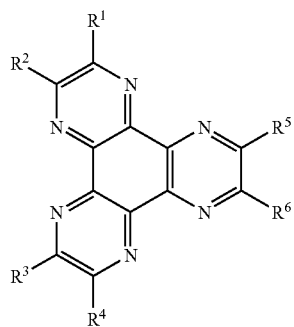

wherein $R^1$ to $R^6$ are each selected from the group consisting of hydrogen, a halogen atom, nitrile (—CN), nitro (—NO$_2$), sulfonyl (—SO$_2$R), sulfoxide (—SOR), sulfonamide (—SO$_2$NR), sulfonate (—SO$_3$R), trifluoromethyl (—CF$_3$), ester (—COOR), amide (—CONHR or —CONRR'), substituted or unsubstituted linear or branched $C_1$-$C_{12}$ alkoxy, substituted or unsubstituted linear or branched $C_1$-$C_{12}$ alkyl, substituted or unsubstituted aromatic or non-aromatic heterocycle, substituted or unsubstituted aryl, substituted or unsubstituted mono-arylamine or di-arylamine, and substituted or unsubstituted aralkylamine, and R and R' are each selected from the group consisting of substituted or unsubstituted $C_1$-$C_{60}$ alkyl, substituted or unsubstituted aryl, and substituted or unsubstituted 5- to 7-membered heterocycle; and wherein formula 1-6 is as follows:

[Formula 1-6]

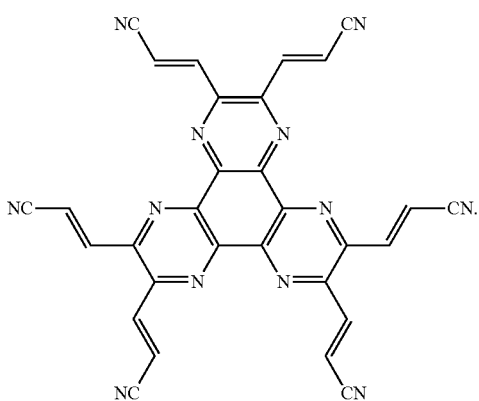

* * * * *